US005631495A

United States Patent [19]
Dunn et al.

[11] Patent Number: 5,631,495
[45] Date of Patent: May 20, 1997

[54] HIGH PERFORMANCE BIPOLAR DEVICES WITH PLURALITY OF BASE CONTACT REGIONS FORMED AROUND THE EMITTER LAYER

[75] Inventors: James S. Dunn, Jericho; Michael D. Hulvey, Burlington; Eric D. Johnson, Westford, all of Vt.; Robert A. Kertis, Rochester, Minn.; Kenneth K. Kieft, III, Essex Junction, Vt.; Albert E. Lanpher, Waterville, Vt.; Nicholas T. Schmidt, Colchester, Vt.

[73] Assignee: International Business Machines Corporation, Armonk, N.Y.

[21] Appl. No.: 346,122

[22] Filed: Nov. 29, 1994

[51] Int. Cl.⁶ .................. H01L 27/082; H01L 29/167
[52] U.S. Cl. .................. 257/587; 257/576; 257/592; 257/655
[58] Field of Search .................. 257/576, 587, 257/592, 655

[56] References Cited

U.S. PATENT DOCUMENTS

| | | | |
|---|---|---|---|
| 4,125,853 | 11/1978 | Fulton et al. | 357/36 |
| 4,338,138 | 7/1982 | Cavaliere et al. | 148/1.5 |
| 4,631,568 | 12/1986 | Gardner | 357/49 |
| 4,647,958 | 3/1987 | Gardner | 357/59 |
| 4,665,424 | 5/1987 | Hirao | 357/34 |
| 4,698,127 | 10/1987 | Hideshima et al. | 156/643 |
| 4,728,618 | 3/1988 | Hirao | 437/33 |
| 4,740,482 | 4/1988 | Hirao | 437/33 |
| 4,803,174 | 2/1989 | Hirao | 437/31 |
| 4,819,055 | 4/1989 | Nakafato et al. | 257/576 |
| 5,036,016 | 7/1991 | Drosd | 437/31 |
| 5,061,982 | 10/1991 | Drosd et al. | 357/43 |
| 5,134,454 | 7/1992 | Neudeck et al. | 257/587 |
| 5,272,357 | 12/1993 | Morishita | 257/587 |
| 5,525,833 | 6/1996 | Jang | 257/587 |
| 5,536,966 | 7/1996 | Robinson et al. | 257/655 |

OTHER PUBLICATIONS

Chiang, et al., "High–Density, High–Performance I²L Cell," IBM Technical Disclosure Bulletin, v. 19, #6, 1976.
Battista, et al., "Variable Transition Device Transistor," IBM Technical Disclosure Bulletin, v. 19, #6, 1976.
Ning et al., "Bipolar Transistor Structure," IBM Technical Disclosure Bulletin, v. 21, #2, 1978.
Verhaar et al., "A 25 µm² Bulk Full CMOS SRAM Cell Technology With Fully Overlapping Contacts," IEDM 90–473, 1990.

*Primary Examiner*—Sara W. Crane
*Assistant Examiner*—Fetsum Abraham
*Attorney, Agent, or Firm*—Heslin & Rothenberg, P.C.

[57] ABSTRACT

High-performance bipolar transistors with improved wiring options and fabrication methods therefore are set forth. The bipolar transistor includes a base contact structure that has multiple contact pads which permit multiple device layouts when wiring to the transistor. For example, a first device layout may comprise a collector-base-emitter device layout, while a second device layout may comprise a collector-emitter-base device layout. More specifically, the base contact structure at least partially surrounds the emitter and has integral contact pads which extend away from the emitter. Further, sections of the base contact structure are disposed on an insulating layer outside of the perimeter of the base region of the transistor, while other sections directly contact the base region. Specific details of the bipolar transistor, and fabrication methods therefore are also set forth.

18 Claims, 8 Drawing Sheets

HIGH PERFORMANCE BIPOLAR DEVICES WITH PLURALITY OF BASE CONTACT REGIONS FORMED AROUND THE EMITTER LAYER

TECHNICAL FIELD

The present invention relates in general to integrated semiconductor circuits formed on substrates. More particularly, the present invention relates to a high-performance bipolar transistor having multiple wiring options for use in integrated circuit chips.

BACKGROUND OF THE INVENTION

By way of general background, a bipolar transistor is a three-terminal device having a base region, a collector region and an emitter region. There is one semiconductor junction between the base and emitter regions, and another junction between the base and collector regions. The collector and emitter regions of a bipolar transistor are doped with impurities that are of the same conductive type, i.e., N-type or P-type, and the base region is of the opposite conductivity type. Thus, a bipolar transistor is said to be an N-P-N or P-N-P type. General theory of operation of bipolar transistors is well known and need not be discussed herein.

For large-scale integrated circuitry, the usual design objectives include high packing density. In particular, many device layouts of transistors are required on typical integrated circuit ("IC") chips to facilitate interconnection of the transistors. For example, it may be desirable for one transistor to have a collector-base-emitter device layout, while a collector-emitter-base device layout may be desirable for a second device on the IC chip. Disadvantageously, transistors with different device layouts typically have different geometries and do not "fit" closely together on a substrate. Thus, the use of a variety of conventional transistors, having different device layouts, typically limits both circuit density and overall wireability.

A further limitation of conventional bipolar transistors is the high-frequency performance of the device. It is well known that there are certain circuit parameters of bipolar transistors that affect the speed of operation and performance at high frequencies. Two of the most significant of these parameters are the base resistance ($R_b$) and the collector-base capacitance ($C_{cb}$). Reduction of either or both of these parameters results in improved speed and high frequency performance. However, in the past, a design having a low $R_b$ typically featured a high $C_{cb}$ and vice-versa. Thus, a need for a device featuring a low $R_b$ and $C_{cb}$ exists.

Thus, there remains a need for a bipolar transistor that provides improved high speed performance, while at the same time allowing substantially greater device packing densities and wiring options. The present invention is directed toward solving the above noted problems, and providing such a device.

DISCLOSURE OF THE INVENTION

To briefly summarize, in a first aspect, the present invention comprises a base contact structure for a transistor having a base region, an emitter region and a collector region. The base contact structure includes a contact region at least partially disposed above, and electrically connected to, the base region of the transistor. Specifically, the contact region at least partially surrounds the transistor's emitter region. Further, the base contact structure includes multiple contact pads with each contact pad being integral with, and extending away from, the emitter region. The multiple contact pads facilitate selective electrical contact to the base region of the transistor through the contact region.

As an enhancement, the emitter region may have four sides. Furthermore, the contact region may have at least three sides, of which each side is associated with a different side of the emitter region. Each side of the contact region may have at least one contact pad integral therewith.

In another aspect, the transistor of the present invention may include a substrate and an insulating layer disposed above the substrate, the insulating layer having a discontinuity therein. The base region of the transistor resides within the discontinuity in the insulating layer. More specifically, the base contact structure has at least two segments which are electrically connected. A first segment of the base contact structure is disposed at least partially above the base region, while a second segment is disposed completely above the insulating layer.

A further aspect of the present invention includes a transistor having a first metallization layer which includes a base contact structure. The base contact structure is electrically connected to the base region and has at least two contact pads on an upper surface thereof. Further, the transistor includes a second metallization layer disposed above the first metallization layer. Specifically, the second metallization layer has a first post electrically coupled to a first contact pad of the base contact structure. A second contact pad of the base contact structure has an insulating layer disposed thereabove.

In yet another aspect of the present invention, a first contact pad is integral with the base contact structure and positioned within a first segment thereof, while a second contact pad is integral with the base contact structure and positioned within a second segment thereof. As a result of this structure, selective electrical connection to the first contact pad facilitates a first device layout and selective electrical connection to the second contact pad facilitates a second, different, device layout.

As examples, the first device layout may comprise a collector-base-emitter device layout and the second device layout may comprise a collector-emitter-base device layout. Optionally, the first segment of said base contact structure may be located such that the first contact pad, collector region and emitter contact structure are disposed in a triangular orientation.

Another aspect of the present invention includes a method for electrically connecting to a transistor which has a base region, an emitter region and a collector region. The method comprises the steps of providing the transistor having a base contact structure which is electrically connected to the base region of the transistor. More particularly, the base contact structure has multiple contact pads integral therewith. The method also includes selecting a first contact pad of the base contact structure and electrically attaching thereto for facilitating electrical connection to the base region of the transistor through the base contact structure.

To summarize, the techniques of the present invention facilitate formation of an advanced bipolar transistor with significant advantages and features. For example, the organization of the diffusion regions of the device of the present invention facilitates formation of a transistor which has both low base resistance ($R_b$) and low collector to base capacitance ($C_{cb}$). Further, the use of a metallized ring surrounding the emitter contact structure and extending beyond the perimeter of the base diffusion region allows the collector-base area to shrink in the "x" and "y" directions. Thus, a higher speed, reduced size device is fabricated with respect to previous technologies.

In addition to reducing the size of the device and providing higher performance, use of the new base contact structure provides significant advantages to a circuit designer's flexibility in wiring a device into a circuit. Currently, different devices are required to facilitate different device layouts (such as emitter-base-collector and base-emitter-collector device layouts). The techniques of the present invention permit the elimination of such multiple devices. Only one device is needed which is capable of a variety of device layouts. As a further advantage, the techniques of the present invention facilitate wiring from the "sides" of the device. This feature gives the designer additional freedom not available in any previous circuit designs.

Along with this new, previously unavailable flexibility, multiple devices within a designer's library may be replaced with a single, high-speed device which facilitates a variety of device layouts. Thus, there is a reduction in the number of devices in a predesigned "library." This translates into fewer device models and therefore results in lower costs for developing and maintaining the technology.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

BEST MODE FOR CARRYING OUT THE INVENTION

A bipolar transistor in accordance with the present invention is described below with respect to the top schematic view of FIG. 7. By way of general description, the transistor has a collector contact structure 49C, an emitter contact structure 49E and a base contact structure 49B. It is particularly important to note from this figure the organization of base contact structure 49B. Specifically, note that base contact structure 49B is formed as a ring, surrounding the emitter. Included in the base contact structure is the contact region which comprises the main body of the ring, and the electrical "contact pads" (for example, 49B', 49B" and 49B'"). Electrical contact may be made to the base region of the transistor through any of these contact pads.

The multiple contacts pads on the base contact structure facilitate a variety of transistor device layouts. For example, if base contact pad 49B' was selected, a collector-base-emitter device layout (i.e. the orientation of electrical connections to the device) would be provided. Alternatively, if base contact pad 49B" was selected, a collector-emitter-base device layout would be provided. It is important to note that contact pads on the "sides" of the device (for example, 49B'") permit additional device layouts. Specifically, if contact pad 49B'" is selected, a right triangular layout is created which includes contact pad 49B'", collector contact structure 49C and emitter contact structure 49E as vertices. In such a case, the collector and emitter contact structures define endpoints of the hypotenuse of the right triangle. Selection of other contacts pads facilitates other triangular device layouts. Thus, the transistor of the present invention provides significant versatility in device wireability and interconnection.

The contact pads are associated with different segments of the base contact structure. The term "segment" as used herein with regard to the rectangular ring shaped base contact structure shown refers to one of the four sides of the base contact structure. Each one of these four segments corresponds to a different one of the four sides of the rectangular shaped emitter contact structure 49E. In the event that an alternately shaped emitter is provided, such as a circular emitter, the base contact structure would have a corresponding, i.e. circular, shape. The term "segments" as used in regard to a circular base contact structure would then refer to arc segments thereof. Each segment would be large enough to facilitate different device configurations if a contact pad disposed thereon was electrically contacted.

Figure 6:
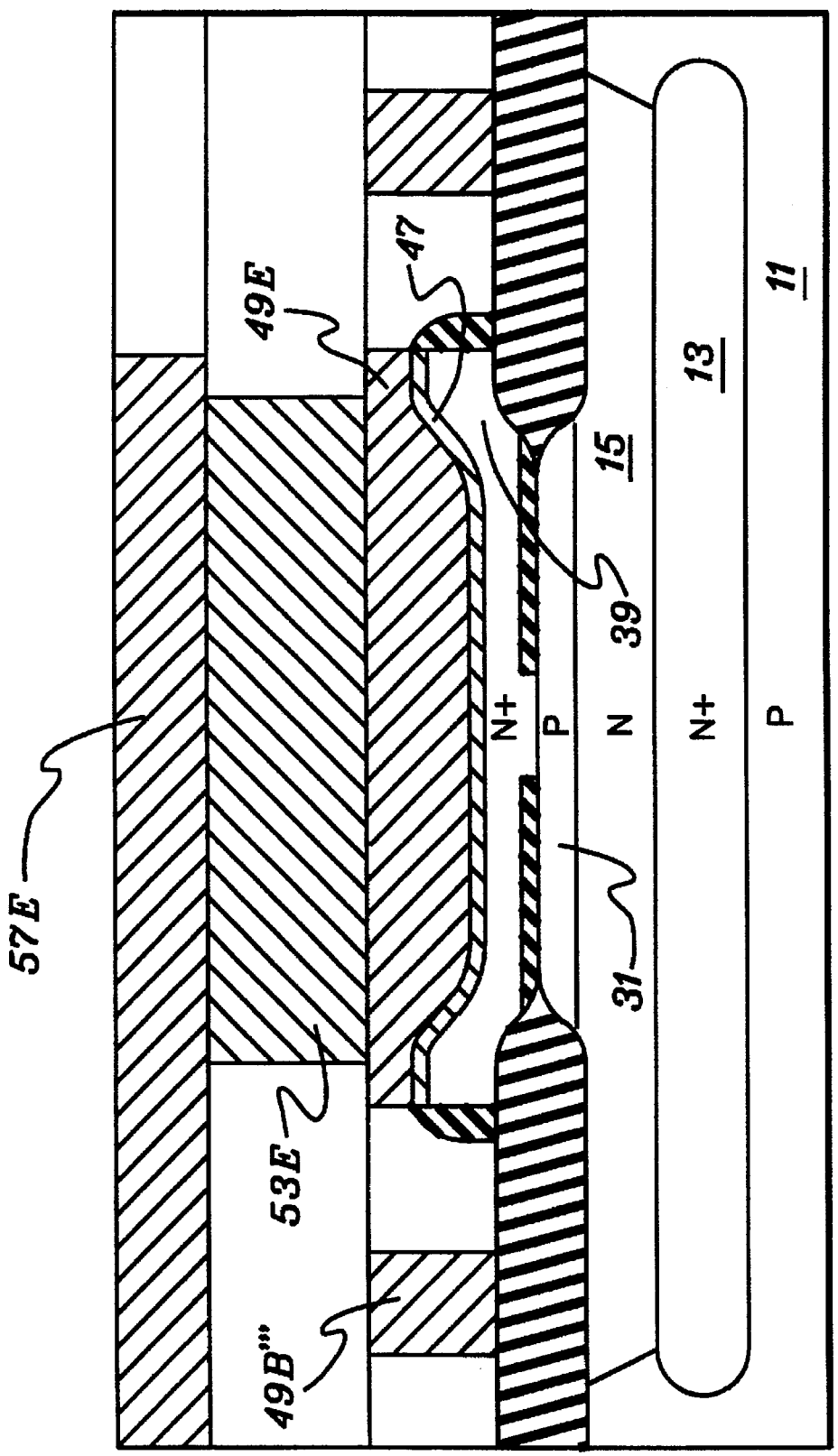
FIG. 6 is an "x-axis" cross-sectional view of the transistor structure of FIG. 7 taken along the "FIG. 6—FIG. 6" cross-sectional line pursuant to one embodiment of the present invention.
Figure 7:
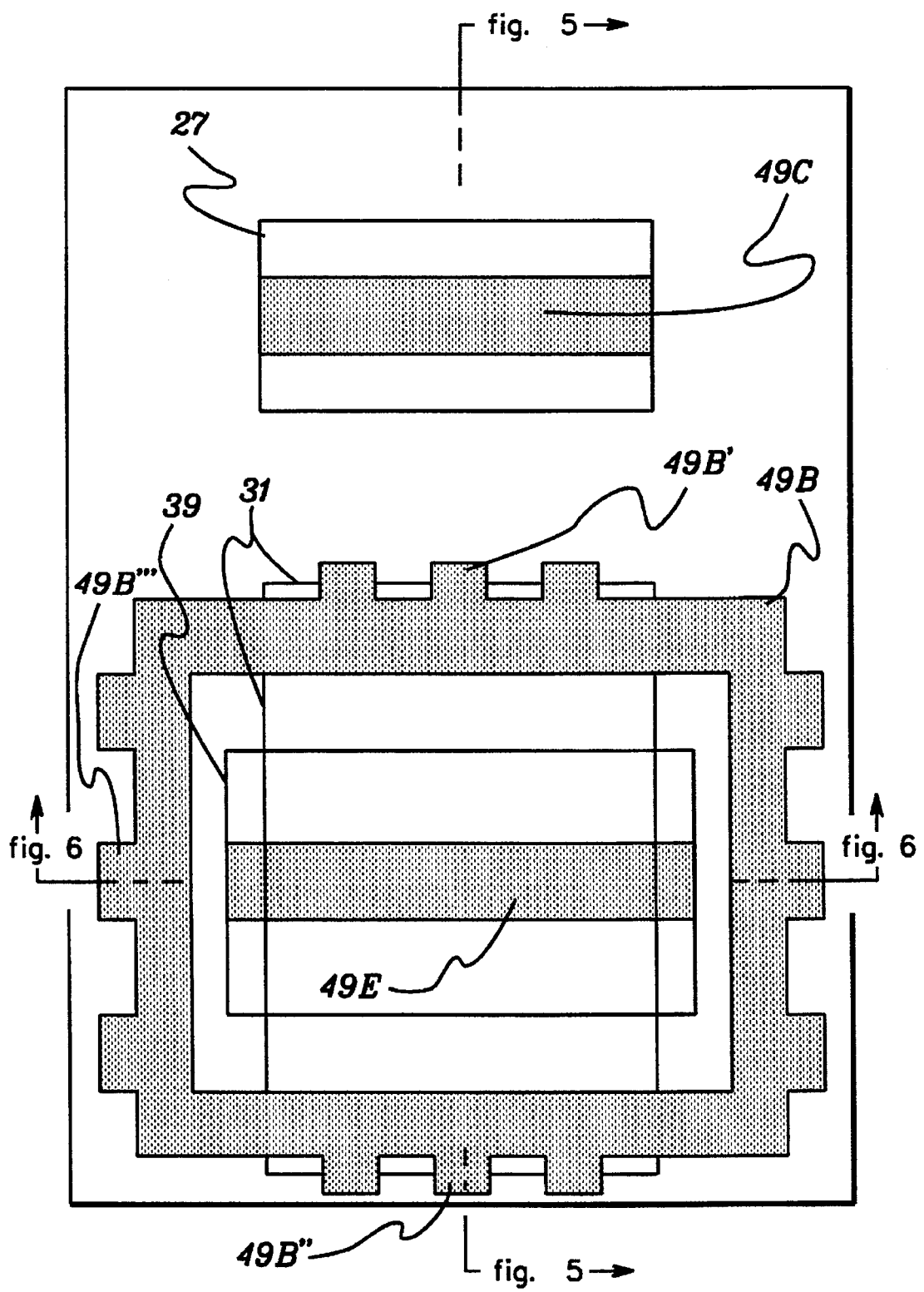
FIG. 7 is a top schematic view of the completed transistor structure of FIGS. 5 and 6 in conformance with an embodiment of the present invention.

As shown in FIG. 7, the contact pads on the base contact structure extend away from the emitter contact structure. This provides adequate spacing such that electrical connection to the contact pads from an above formed metallization layer (not shown—see, for example, FIGS. 5 and 6) may be performed without danger of shorting to electrical connections to the emitter contact structure. Alternatively, contact pads could be integrated into the contact region of the base contact structure, eliminating the "extending" contact pads shown herein. However, this would require higher precision in contacting the emitter contact structure and base contact structure so as to avoid short circuits as discussed hereinabove.

A further purpose of the base contact structure is to facilitate a base diffusion region 33 that is reduced in size in both the "x" and "y" directions, while still providing versatile wireability. This is achieved by extending segments of the base contact structure and contact pads integral therewith outside of the perimeter of the reduced size base diffusion region so as to provide adequate distance from the emitter contact structure. More specifically, contact pads 49B' and 49B" extend beyond the perimeter of the base diffusion region, and the "side" segments of the base contact structure (one of which contains contact pad 49B''') are disposed completely outside of the perimeter of the base diffusion region. Thus, even though the base diffusion region has been reduced in size, wireability thereto is still facilitated. Advantageously, a smaller base diffusion region contributes to a lower collector-base capacitance ($C_{cb}$), improving the high-speed performance of the device.

Also shown in FIG. 7 is the relationship between the various diffusion regions of the device. Particularly, the collector N+ diffusion region 27 surrounds collector contact structure 49C. Further, base contact structure 49B surrounds emitter contact structure 49E. Beneath a portion of base contact structure 49B and surrounding emitter contact structure 47 are emitter polysilicon region 39 and base diffusion region 31 (see also FIGS. 5 and 6).

Fabrication methods for forming a bipolar transistor in accordance with the present invention are described below. Each individual processing step described herein may be performed by standard chip or wafer level processing as will be apparent to those skilled in the semiconductor fabrication art.

Figure 1:
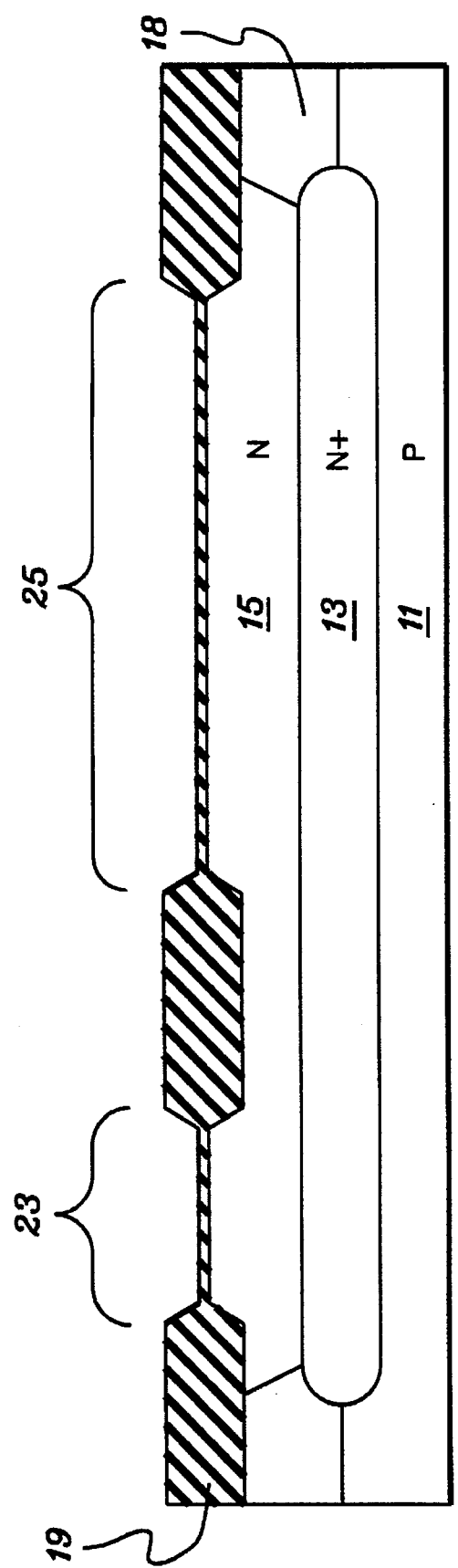
FIG. 1 is a cross-sectional view of an incomplete transistor structure after formation of various diffusion regions according to one embodiment of a fabrication process of the present invention.

Referring to FIG. 1, substrate 11 provides a support for the transistor. The substrate may be composed of a conventional substrate material such as, for example, P-doped silicon. A masked implantation process is then used to form buried N+ diffusion layer 13 in the top of substrate 11 using a masked implantation of, for example, antimony. Epitaxial region 18, composed of, for example, P-doped silicon is then grown (in a furnace) on the surface of substrate 11. As epitaxial layer 18 grows, buried N+ layer 13 diffuses down into the substrate, as well as up into growing epitaxial layer 18. Thus, buried N+ layer 13 is formed with the N+ diffusion centered around the interface between substrate 11 and grown epitaxial layer 18.

The top of epitaxial layer 18 is then implanted to form N-well region 15. Specifically, a masked implantation process is used to implant the N diffusion using, for example, phosphorus. Thereafter, standard recessed oxidation ("ROX") processing is used to form an insulating layer 19 as shown. In particular, thin insulating (oxide) regions within insulating layer 19 are formed as shown such that a collector region 23 and a base/emitter region 25 can be defined. After insulating layer 19 has been formed, a conventional mask/etch process is used to remove the thin insulating material covering collector region 23 and base/emitter region 25. Thus, collector region 23 and base/emitter region 25 are contained within discontinuities in insulating layer 19.

Figure 2:
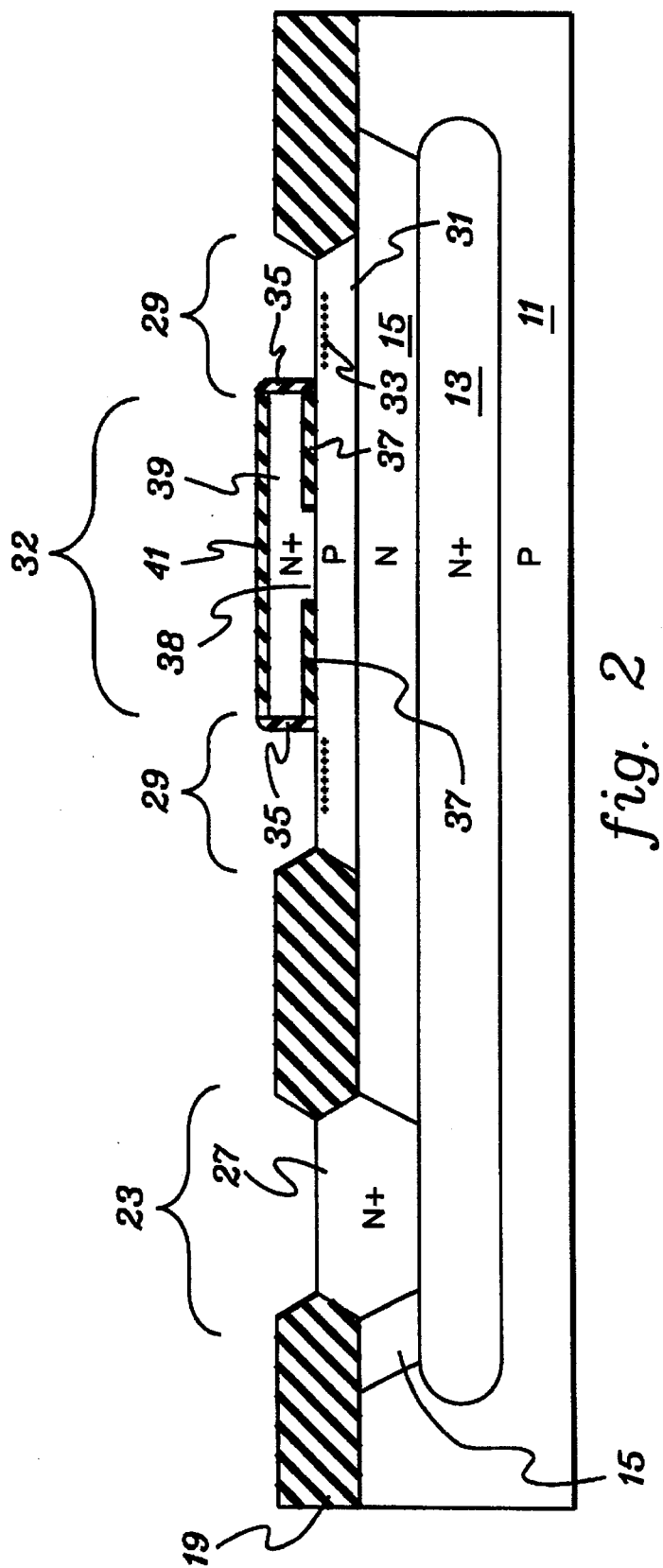
FIG. 2 is a cross-sectional view of the transistor structure of FIG. 1 subsequent to the formation of a collector diffusion region and an emitter structure pursuant to an embodiment of the present invention.

Referring to FIG. 2, processing continues with the implantation of collector diffusion region 27. For example, a masked implantation process using phosphorus may provide an N+ doping within the collector diffusion region. Thereafter, the collector region is masked, and base emitter region 25 (FIG. 1) is implanted with, for example, boron, forming a P doped base diffusion region 31.

Further process steps may now be performed to fabricate the emitter of the transistor of the present invention. As a typical process example, thin oxide layer 37 is conformally grown on the top surface of the wafer. Conventional photolithographic processing is then used to open emitter window 38 within the oxide layer. Polysilicon layer 39 is deposited above thin oxide layer 37, and implanted with an N+ diffusion using, for example, arsenic. Nitride layer 41 is formed thereabove, conformally coating polysilicon layer 39. Thus, the requisite layers have been formed in anticipation of emitter definition.

To continue, the emitter may be defined using conventional photolithographic processing. For example, a photoresist layer is deposited, exposed and developed such that a mask is formed protecting emitter region 32. Selective etches are then performed such that nitride layer 41, polysilicon layer 39 and oxide layer 37 are removed everywhere on the wafer except for the protected emitter region 32. The mask is removed, and formation of the emitter continues with the fabrication of oxide sidewall spacers 35. As a typical process example, an oxide layer is conformally deposited on the surface of the wafer, and reactive ion etching ("RIE") is used to remove the oxide in all places but the vertical sidewalls of the emitter, thereby forming spacers 35. Thus, formation of the emitter structure is completed.

Processing then continues with further doping of the base diffusion region of the transistor. Specifically, a photolithographic mask is formed which protects all regions but base/emitter region 25 (FIG. 1). Similarly, nitride layer 41 prevents diffusion into emitter polysilicon 39. Thereafter, an upper portion of base diffusion region 31 is implanted using, for example, boron. Thus, P+ region 33 is formed within the very top of the base diffusion region 31 (except under the emitter). Nitride layer 41 may then be stripped using, for example, a selective nitride etch process.

Operationally, P+ diffusion region 33 decreases extrinsic base region resistance ($R_b$). This is one of the factors that contributes to improved high speed performance of the transistor. Specifically, when base region 31 is contacted through P+ region 33, the heavy P+ doping facilitates better conductivity into the base diffusion region. (Note: the extrinsic base region is the area of base diffusion region 31 located outside of a region underneath emitter polysilicon 39, while the intrinsic base region refers to the region of base diffusion region 31 located underneath emitter polysilicon 39.)

Figure 3:
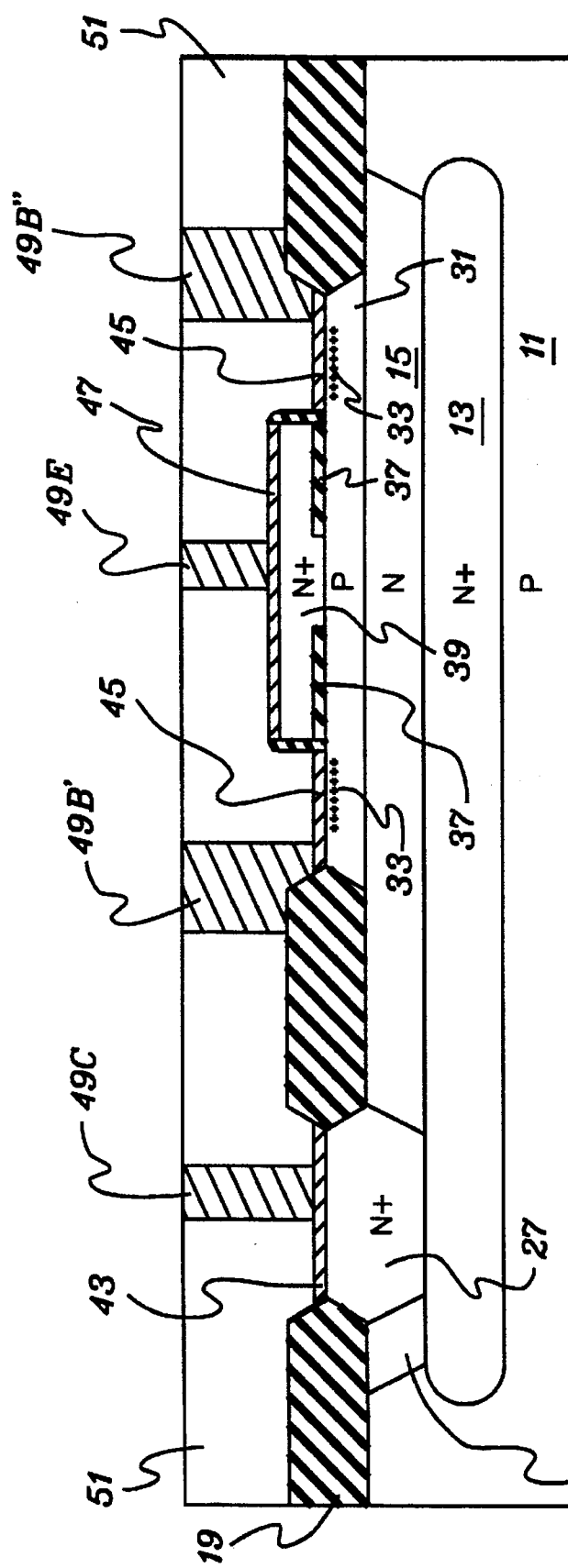
FIG. 3 is a cross-sectional view of the transistor structure of FIG. 2 after the formation of base, emitter and collector contact structures thereon in accordance with one embodiment of the present invention.

A further process step involves the formation of a titanium silicide layer on the base, emitter and collector diffusion regions as so as to decrease electrical resistance when electrically contacting thereto. Accordingly, a conformal layer of titanium is deposited on the wafer, and the wafer is heated in a furnace (i.e., a reactor). The titanium reacts with the silicon surfaces to form titanium silicide ($T_iS_{ix}$), and a selective etch is then performed to remove unreacted titanium (the titanium on the oxide surfaces). As shown in FIG. 3, collector silicide 43, base silicide 45, and emitter silicide 47 are formed. Thus, electrical connectivity to the base, emitter and collector regions of the transistor is enhanced.

Subsequent process steps involve the formation of electrical contact structures for facilitating electrical connection to the base, emitter and collector of the transistor. Accordingly, base, emitter and collector contact structures are formed from a metallization layer fabricated on the surface of the wafer (FIG. 3). Specifically, collector contact structure 49C is in contact with collector silicide 43 which electrically contacts the collector N+ diffusion region 27. Similarly, base contact structures 49B' and 49B" electrically contact base silicide 45 which electrically contacts base diffusion region 31/33; and emitter contact structure 49E electrically contacts emitter silicide 47 which electrically contacts emitter diffusion region 39.

It should be noted that at this cross-sectional location, base contact structures 49B' and 49B" "butt" against the thick portion of insulator 19 which defines the base/emitter region. Thus, as shown, a first portion of the base contact structure is disposed on insulator layer 19, while a second portion of the base contact structure is disposed on base silicide region 45. The specific spacial relationship of base contact structure 49B to oxide layer 19 and base diffusion region 31 varies depending on the location within the transistor structure (see, for example, FIGS. 6 and 7).

As a specific process example, formation of the metallization layer containing contact structures 49C, 49B' and 49B" and 49E may be performed by the following sequence. Insulating layer 51 comprising, for example, an oxide or phosphosilicate glass ("PSG") is deposited on the surface of the wafer. Conventional photolithographic mask and etch techniques are then performed such that openings for contact structures 49C, 49B', 49B" and 49E are formed. Thereafter, a conductor comprising, for example, tungsten is deposited on the wafer, filling the etched openings. The wafer is then planarized, removing excess conductor, and forming the structure shown in FIG. 3. Planarization may be performed by, for example, chemical-mechanical polishing ("CMP") of the surface of the wafer. See, for example, U.S. Pat. No. 4,944,836, "Chem-Mech Polishing Method For Producing Coplanar Metal-Insulator Films On A Substrate," issued Jul. 31, 1990 and hereby incorporated herein by reference.

Figure 4:
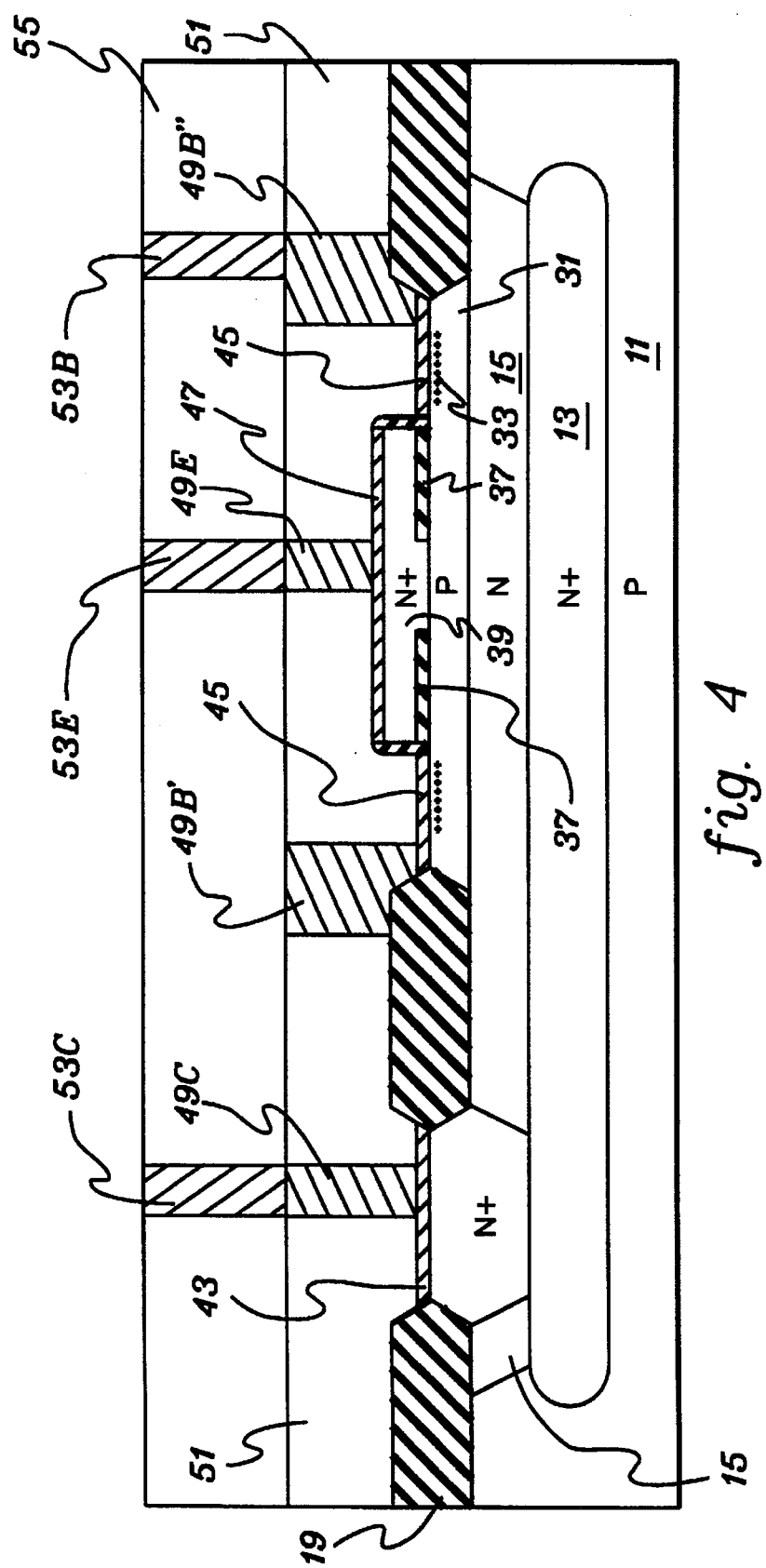
FIG. 4 is a cross-sectional view of the transistor structure of FIG. 3 subsequent to the formation of a metallization layer on the contact structures in conformance with an embodiment of the present invention.

As shown in FIG. 4, processing continues with the formation of a second metallization layer, electrically connected to portions of the interconnect structures formed therebelow. This layer is formed within insulating layer 55 using, for example, the conventional metallization layer formation processes described hereinabove. In particular, collector post 53C is in electrical contact with collector contact structure 49C and emitter post 53E is in electrical contact with emitter contact structure 49E. Base post 53B is in electrical contact with base contact pad 49B" (part of base contact structure 49B—FIG. 7). Thus, electrical contact to the emitter, base and collector of the transistor is possible from the top of insulating layer 55.

Selection of an electrical contact pads on base contact structure 49B (i.e., one of the contact pads formed as part of the base contact structure 49B, as shown in, for example, FIG. 7) is based upon the device layout desired. In this particular example, as shown, a "collector-emitter-base" device layout is provided. It should be generally noted that if base metal 53B contacted the other base contact pad 49B', a "collector-base-emitter" device layout would be provided. During fabrication of the metallization layer including posts 53C, 53B and 53E, the masks are tailored to facilitate formation of a transistor with the selected device layout.

Figure 5:
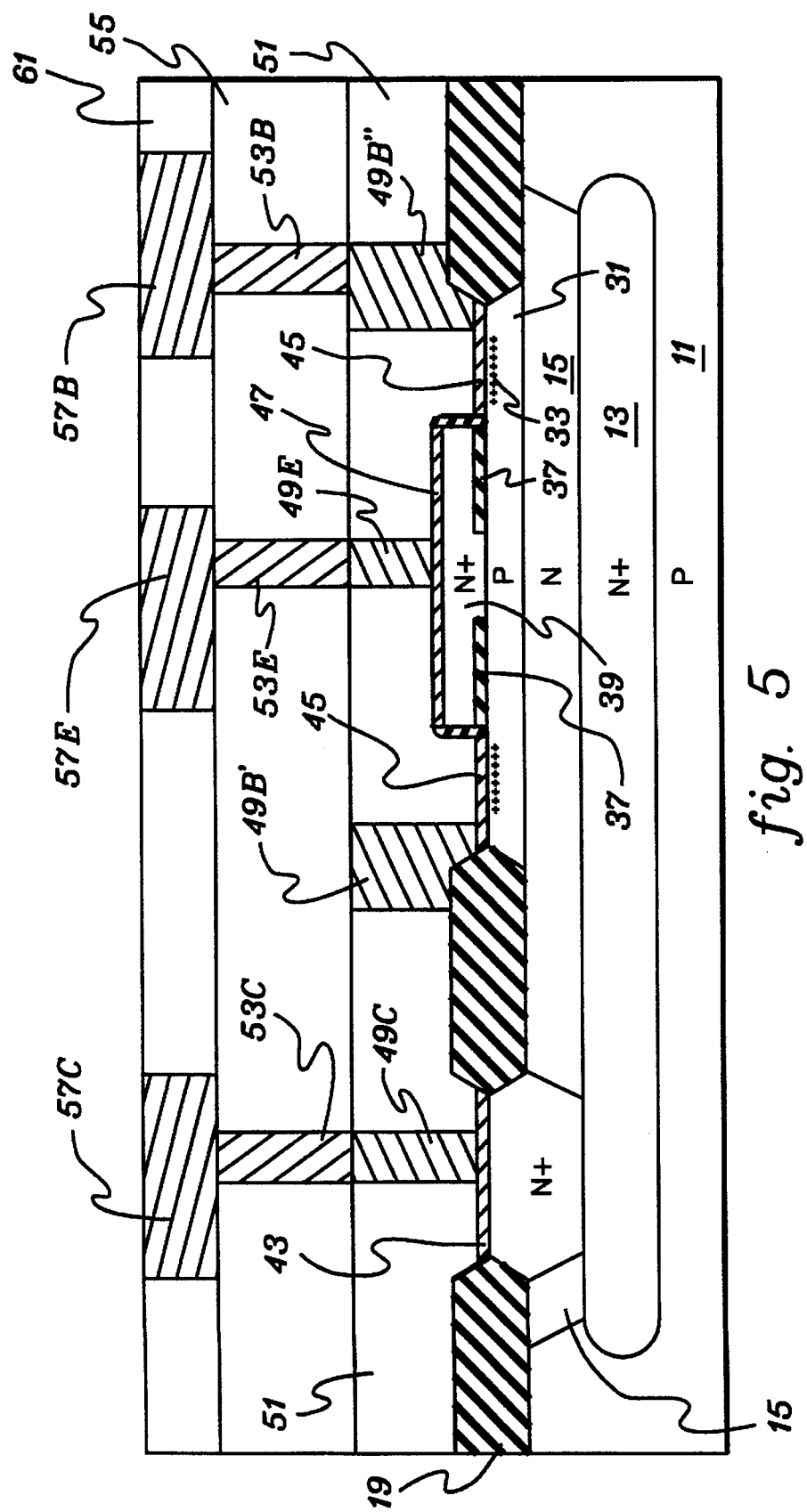
FIG. 5 is a cross-sectional view of the transistor structure of FIG. 4 after fabrication of a wiring metallization layer, completing formation of a transistor according to an embodiment of the present invention.

Processing then continues with the formation of a "wiring" metallization layer which electrically attaches to the transistor formed therebelow. This is the metallization layer used to interconnect the devices on an the IC chip containing the transistor(s) of the present invention. Accordingly, conventional metallization layer forming techniques as described hereinabove are used to form "M1" wiring metallization layer within insulating layer 61 (FIG. 5). The "M1" metallization layer contains collector wiring 57C, emitter wiring 57E and base wiring 57B. It is important to note that the wiring pattern will change depending upon the selected device layout. Thus, the "M1" wiring pattern is significantly affected by the selection of which of the contact pads of the base contact structure are used for electrical attachment.

The "x-axis" cross-sectional view of the transistor of FIG. 7 is presented in FIG. 6. As a general note, in contrast to contact pads 49B' and 49B" (FIG. 5), contact pad 49B'" is disposed completely on insulating layer 19. This facilitates adequate spacing of the base contact pads on the "sides" of the emitter (e.g., contact pad 49B'") from emitter contact structure 49E.

A further aspect to note in this view is the M1 emitter metallization layer 57E passing over base contact structure 49B. The "tiered" metallization layers of the present invention facilitate such versatile interconnection, i.e., a full metallized ring may surround the base, but does not interfere with the ultimate wiring of the device. In fact, wiring versatility is enhanced by the multiple contact pads available for electrically connecting to the base contact structure.

Figure 8:
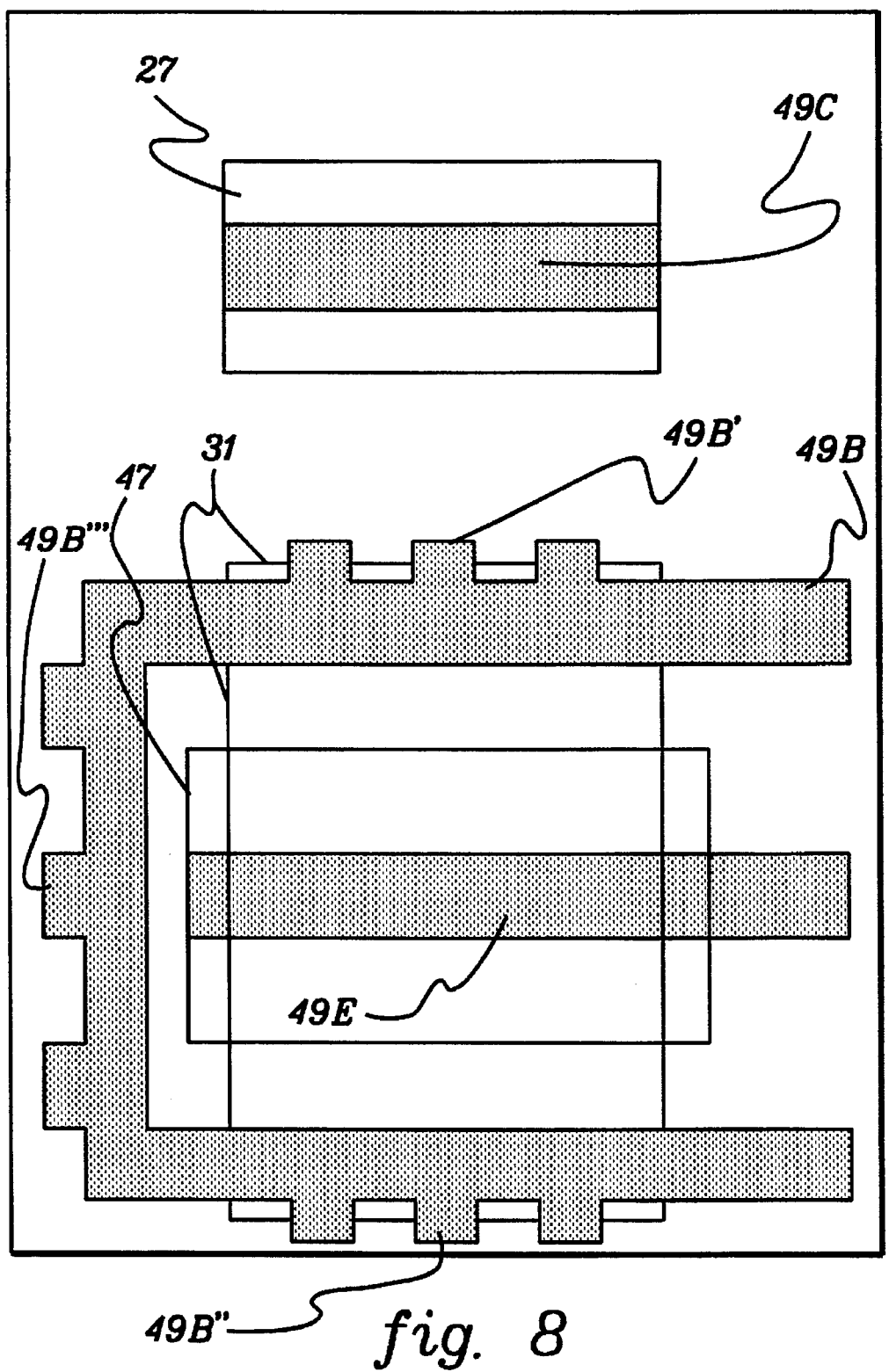
FIG. 8 is a top schematic view of a completed transistor structure having the base contact structure surrounding the emitter contact structure on three sides thereof in accordance with one embodiment of the present invention.

Another embodiment of the present invention is shown in FIG. 8. In this particular embodiment, an alternative to the complete "ring" base contact structure is shown. Of course, this base contact structure design allows electrical contact thereto from only three sides of the device. However, the "C" shape may in some circumstances facilitate more flexible wiring to the emitter of the device (from the "open" side).

The techniques of the present invention facilitate formation of an advanced bipolar transistor with significant advantages and features. For example, the organization of the diffusion regions of the device of the present invention facilitates formation of a transistor which has both low base resistance ($R_b$) and low collector to base capacitance ($C_{cb}$). Further, the use of a metallized ring surrounding the emitter contact structure and extending beyond the perimeter of the base diffusion region allows the collector-base area to shrink in the "x" and "y" directions. Thus, a higher speed, reduced size device is fabricated with respect to previous technologies.

In addition to reducing the size of the device and providing higher performance, use of the new base contact structure provides significant advantages to a circuit designer's flexibility in wiring a device into a circuit. Currently, different devices are required to facilitate different device layouts (such as emitter-base-collector and base-emitter-collector device layouts). The techniques of the present invention permit the elimination of such multiple devices. Only one device is needed which is capable of a variety of device layouts. As a further advantage, the techniques of the present invention facilitate wiring from the "sides" of the device. This feature gives the designer additional freedom not available in any previous circuit designs.

Thus, an integrated circuit chip could be provided containing homogeneous transistors (i.e., the one of the present invention in a variety of sizes). Personalization with respect to device layout would be facilitated merely by different wiring options. This flexibility results in higher density circuit layouts and makes design changes easier and quicker to implement.

Along with this new, previously unavailable flexibility, multiple devices within a designer's library may be replaced with a single, high-speed device which facilitates a variety of device layouts. Thus, there is a reduction in the number of devices in a predesigned "library." This translates into fewer device models and therefore results in lower costs for developing and maintaining the technology.

While the invention has been described in detail herein, in accordance with certain preferred embodiments thereof, many modifications and changes therein may be affected by those skilled in the art. Accordingly, it is intended by the appended claims to cover all such modifications and changes as fall within the true spirit and scope of the invention.

We claim:

1. A base contact structure for a transistor having a base region, an emitter region and a collector region, said base contact structure comprising:

a unitary electrical contact structure at least partially disposed above, and electrically connected to, said base region of said transistor, said unitary electrical contact structure at least partially surrounding three sides of said emitter region of said transistor; and wherein said unitary electrical contact structure includes a plurality of contact regions, each contact region of said plurality of contact regions extending away from said emitter region, said plurality of contact regions facilitating selective electrical contact to said base region of said transistor through said unitary electrical contact structure.

2. The base contact structure of claim 1, wherein said emitter region has four sides, and wherein said unitary electrical contact structure has at least three sides, each side of said at least three sides of said unitary electrical contact structure being adjacent to a different side of said four sides of said emitter region.

3. The base contact structure of claim 2, wherein each side of said unitary electrical contact structure has at least one contact region therein.

4. The base contact structure of claim 2, wherein said unitary electrical contact structure encircles said emitter region and has four sides, each side of said four sides of said unitary electrical contact structure having at least one contact pad integral therewith.

5. A transistor having a base region, an emitter region and a collector region, said transistor further comprising:

a substrate;

an insulating layer disposed above said substrate, said insulating layer having a discontinuity therein, said base region residing within said discontinuity in said insulating layer;

a unitary base contact structure in electrical contact with said base region, said unitary base contact structure at least partially surrounding three sides of said emitter region, said base contact structure having at least three planar legs, said at least three planar legs being electrically connected, each planar leg of said at least three planar legs being adjacent to a different side of said emitter region;

a first planar leg of said at least three planar legs of said unitary base contact structure being disposed at least partially above said base region; and a second planar leg of said at least three planar legs of said base contact structure being disposed completely above said insulating layer so as not to reside over said base region.

6. The transistor of claim 5, wherein said emitter region has four sides, and wherein said first planar leg of said at least three planar legs of said unitary base contact structure is adjacent to a first side of said four sides of said emitter region, and said second planar leg of said at least three planar legs of said unitary base contact structure is adjacent to a second side of said four sides of said emitter region, said first side of said emitter region and said second side of said emitter region being substantially perpendicular.

7. The transistor of claim 6, wherein said unitary base contact structure encircles said emitter region and has four sides, a first side of said four sides of said base contact structure comprising said first planar leg of said at least three planar legs of said unitary base contact structure, and a second side of said four sides of said unitary base contact structure comprising said second planar leg of said at least three planar legs of said unitary base contact structure.

8. The transistor of claim 7, wherein said unitary base contact structure further includes a third planar leg disposed at least partially above said base region of said transistor and comprising a third side of said four sides of said unitary base contact structure, said third side of said unitary base contact region being adjacent to a third side of said emitter region and parallel to said first planar leg of said unitary base contact structure.

9. The transistor of claim 8, wherein said unitary base contact structure further includes a fourth planar leg disposed completely above said insulating layer so as not to reside over said base region, said fourth planar leg comprising a fourth side of said four sides of said unitary base contact structure, said fourth side of said unitary base contact structure being adjacent to a fourth side of said emitter region and parallel to said second planar leg of said unitary base contact structure.

10. A transistor having a base region, an emitter region and a collector region, said transistor further comprising:

a first metallization layer including a unitary base contact structure, said unitary base contact structure being electrically connected to said base region, and said unitary base contact structure at least partially surrounding three sides of said emitter region and having at least two contact pads on an upper surface thereof;

a second metallization layer disposed above said first metallization layer, said second metallization layer having a first post electrically coupled to a first contact pad of said at least two contact pads of said unitary base contact structure; and an insulating layer disposed over a second contact pad of said at least two contact pads of said unitary base contact structure to electrically insulate said second contact pad of said unitary base contact structure.

11. The transistor of claim 10, wherein said first metallization layer further includes a collector contact structure and an emitter contact structure, said collector contact structure being electrically connected to said collector region of said transistor and said emitter contact structure being electrically connected to said emitter region of said transistor.

12. The transistor of claim 11, wherein said second metallization layer further includes a second post electrically coupled to said emitter contact structure, and a third post electrically coupled to said collector contact structure for facilitating electrical contact to said collector region through said collector contact structure and to said emitter region through said emitter contact structure.

13. The transistor of claim 12, further including a third metallization layer, said third metallization layer having a first section electrically coupled to said first post of said second metallization layer for facilitating electrical connection to said base region of said transistor.

14. The transistor of claim 12, further including a third metallization layer, said third metallization layer having a second section electrically coupled to said second post of said second metallization layer, a portion of said second section of said third metallization layer being disposed above said second contact pad of said unitary base contact structure.

15. A transistor having a base region, an emitter region and a collector region, said transistor further comprising:

an emitter contact structure disposed above, and electrically connected to, said emitter region;

a unitary base contact structure partially disposed above, and electrically connected to, said base region, said unitary base contact structure at least partially surrounding said emitter contact structure, and said unitary base contact structure having a plurality of planar legs, said plurality of planar legs being electrically interconnected;

a first contact pad integral with said unitary base contact structure and positioned within a first planar leg of said plurality of planar legs of said unitary base contact structure; and a second contact pad integral with said unitary base contact structure and positioned within a second planar leg of said plurality of planar legs of said unitary base contact structure, wherein electrical connection to said first contact pad facilitates a first contact layout and electrical connection to said second contact pad facilitates a second contact layout, said first contact layout and said second contact layout being different contact layouts viewed from a plan view of said transistor.

16. The transistor of claim 15, wherein said first contact layout comprises a collector-base-emitter contact layout and wherein said second contact layout comprises a collector-emitter-base contact layout.

17. The transistor of claim 15, wherein said first contact pad of said unitary base contact structure is positioned such that said first contact pad, said collector region and said emitter contact structure are disposed in a triangular orientation viewed from a plan view of the transistor.

18. The transistor of claim 17, wherein said triangular orientation comprises a substantially right triangular orientation, and wherein said collector region and said first contact pad define endpoints of a hypotenuse of said substantially right triangular orientation viewed from said plan view of the transistor.

* * * * *